United States Patent [19]

Williamson et al.

[11] 3,736,857

[45] June 5, 1973

[54] PRINTED CIRCUIT MASK MANUFACTURE

[75] Inventors: Reginald Ian Williamson, Sandbach; Roy Lowey, Poynton, both of England

[73] Assignee: L. T. W. Electronics Limited, Congleton, England

[22] Filed: Feb. 8, 1971

[21] Appl. No.: 113,348

[30] Foreign Application Priority Data

Mar. 4, 1970 Great Britain ....................10,358/70

[52] U.S. Cl. ....................................................95/12

[51] Int. Cl. ..............................................B43l 13/18

[58] Field of Search....................................95/1, 12

[56] References Cited

UNITED STATES PATENTS 3,103,849 9/1963 Wise........................................95/12

3,330,182 7/1967 Gerber........................................95/1

*Primary Examiner*—John M. Horan

*Attorney*—Toren & McGeady

[57] ABSTRACT

Apparatus for forming a photographic image used in printed circuit formation comprising a very accurate fixed master mask with a plurality of colored or polarized transparencies, a diaphragm with a like plurality of colored or polarized transparencies any one of which can be brought into alignment with the master mask to select one of the transparencies thereon, and an optical system sending light through the diaphragm and mask to form an accurately dimensioned and located image of the mask on a photographic surface.

8 Claims, 4 Drawing Figures

INVENTOR:
R.I. WILLIAMSON
BY R. LOWEY
Toren & McGeady
ATTORNEYS

INVENTOR:
R. I. WILLIAMSON
BY R. LOWEY
Toren & McGeady
ATTORNEYS

PRINTED CIRCUIT MASK MANUFACTURE

Our invention relates to means for photographically producing a mask, and has for its object the provision of extreme accuracy in the registration of the various portions of the mask and the sizes of the mask areas.

Our invention is more particularly concerned with the production of a mask or pattern to be used in the manufacture of printed circuits. In this connection it is known for an insulating base having a covering of a sheet of an electrical conductor such as copper, to be provided on the copper side with a light-sensitive layer as for example of gelatine with potassium bichromate incorporated therein. Exposure of parts of this layer to light causes the gelatine in the said parts to harden, with the result that when the layer is washed in hot water, the unhardened gelatine is removed and the hardened gelatine remains as a mask. The uncovered copper is then removed by a chemical such as ferric chloride, and finally the hardened gelatine is also removed. This leaves a printed circuit.

In view of the increased miniaturization of such products, it is essential that the mask be made with extreme accuracy. For this propose it is known to expose various portions of the mask, which is itself a photographic film, sequentially to light from holes in a pattern or shutter, the latter being brought into exact register with an optical system through which light is projected on to the film. Lines can be made on the mask by exposing the sensitive material continuously to light through a hole, and then drawing the sensitive material in straight or curved lines below the optic axis of the apparatus. However, if several apertures are formed in a diaphragm so as to produce various sized spots on the photographic mask, it is difficult to cause registration of the holes with the optical system of sufficient accuracy to ensure that the resultant mask is correctly made.

We have therefore devised a method and apparatus for producing spots or shapes on a photographic film or plate with a high degree of accuracy of size and location.

According to one aspect of the present invention there is provided a method of forming a photographic image by means of an optical projection system, the method including the steps of providing a transparent master mask with a plurality of accurately dimensioned shapes therein, locating the mask with high accuracy with respect to the optical system, associating an opaque variable diaphragm with said master mask, said diaphragm defining a plurality of patterned apertures, locating the diaphragm so as to select a particular shape from the master mask for reproduction on a photographic base, the exact position and shape of the image being determined by the mask, and projecting light through the optical system, mask and diaphragm.

According to another aspect of the present invention there is provided apparatus for forming a photographic image comprising a source of light, an opaque variable diaphragm defining a plurality of patterned apertures or transparent parts, a transparent master mask defining a plurality of accurately dimensional shapes and located accurately with respect to an optical system adapted to project an image of the master mask on a photographic base, and means enabling the diaphragm to determine which of said master mask shapes is effectively projected by the light from said source on said photographic base.

In the accompanying drawings to which attention is now directed,

Figure 1:
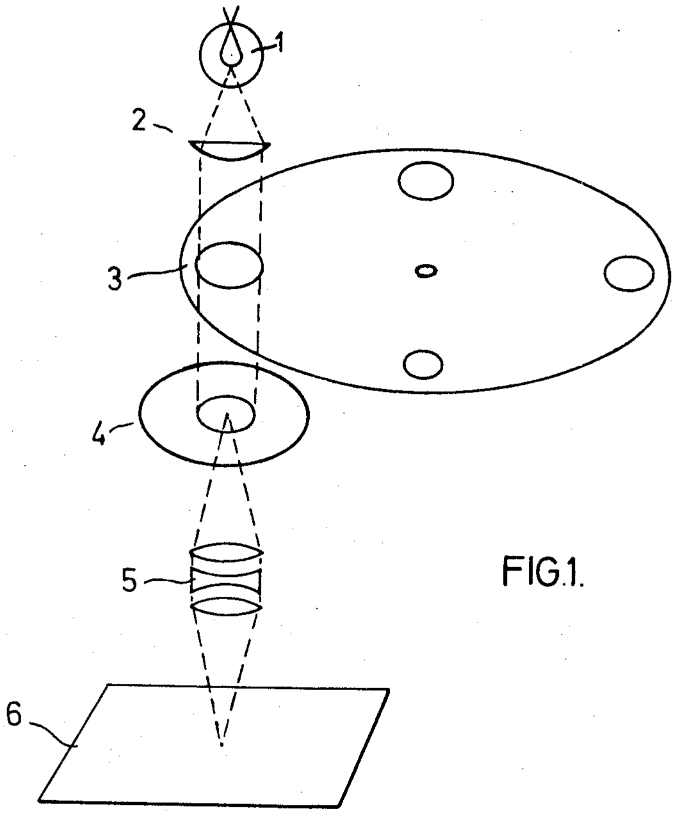
FIG. 1 shows the principle on which the apparatus works.
Figure 3:
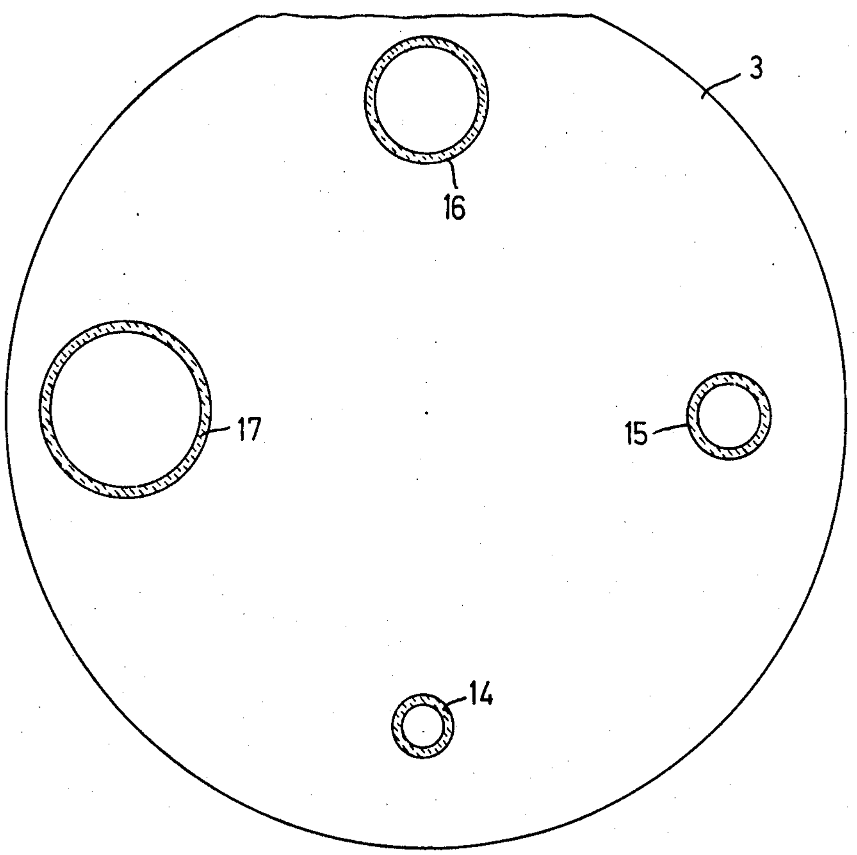
FIG. 3 is a plan view of the rotary diaphragm.

FIG. 1 shows an illuminant 1 which supplies light through a collimator 2 to a circular hole 7 formed in an opaque rotatable diaphragm 3 (FIG. 3). It should of course be understood that the diaphragm may be a sliding one, or may be of iris construction. Again, Waterhouse stops may be placed into a suitable slide or receptacle. The function of the diaphragm and its holes is to select a particular size of spot to be projected, the exact location and size of the projected spot being determined by a mask as later described.

Figure 4:
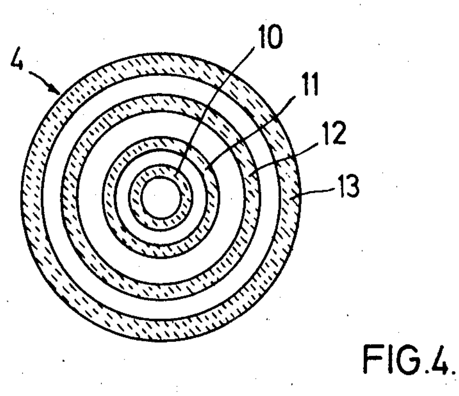
FIG. 4 is a plan view of the master mask.

Below the diaphragm there is a transparent master mask 4 (FIG. 4) with ring shapes thereon; this is followed by a projector lens 5 which projects a reduced image of the mask on a film 6. For the purposes of this description it will be assumed that a circular spot is to be produced on the film. The shape of the image is decided by the shapes of the holes in the diaphragm 3 and the markings on the master mask 4. If a spot is projected, lines can be drawn on the film 6 by moving the latter with respect to the optical system.

The mask 4, in one embodiment of our invention comprises a series of concentric rings 10, 11, 12, 13 of a predetermined color such as deep yellow, the light through which, if originally white, is sufficiently actinic to expose the material of the film 6. There are holes in the diaphragm 3, which is a disc pivoted at its center and which itself may be a photographic film exposed and developed so as to leave clear areas for the holes. Each hole has an internal ring border 14, 15, 16, 17 of a complementary color such as deep blue, the light passing through which, if initially white, is also sufficiently actinic to expose the film 6. The two colors are such that when superimposed, substantially all light from the illuminant 1 is blocked off from the film 6. The diaphragm and mask are located close together and parallel.

Figure 2:
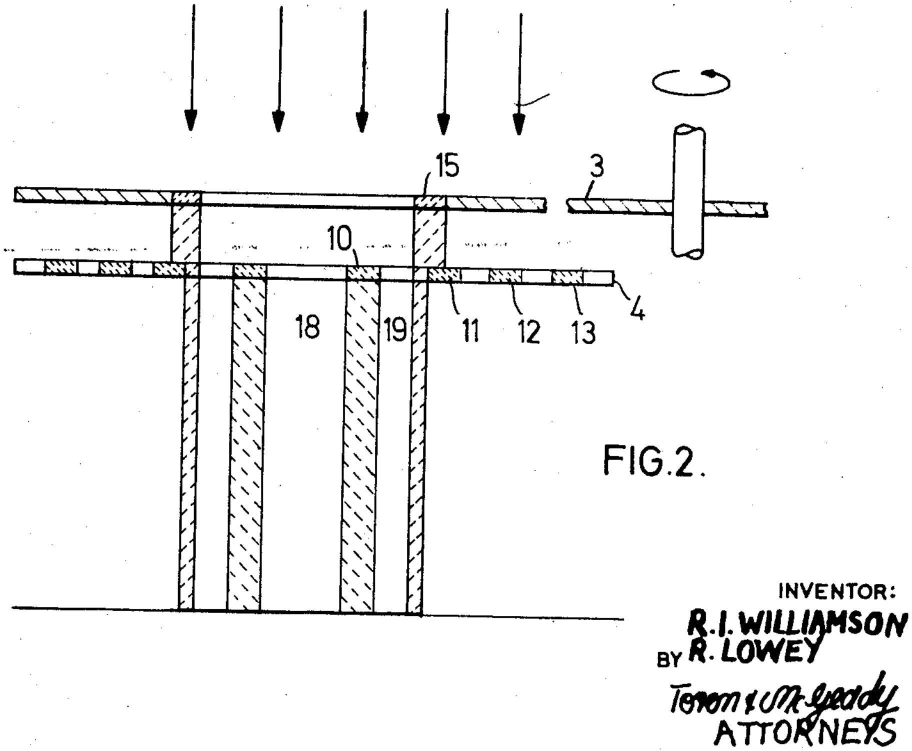
FIG. 2 is a side view of a rotary diaphragm and master mask.

Referring now to FIG. 2, this shows a diagrammatic side view of the two masks together with light paths through the combination. The diaphragm 3 is rotated until a hole of the required size is indexed in position with respect to the optical system. Collimated white light is now shone on to the upper surface of the diaphragm, forming a blue illumination by means of ring 15, with a white center, on the mask 4. This blue ring, the second from the smallest, overlaps the second yellow ring 11, so that a center white circle 18 appears on the film 6 via the optical system 5 (FIG. 1). The circle is surrounded by an annulus of yellow light from the ring 10; then follows an annulus of white light 19 and finally an annulus of blue light from ring 15. The outer perimeter of this ring is however determined by the inner edge of yellow ring 11, so that although the approximate size of the exposure to be made is determined by the diaphragm 3, the exact size of the exposure and its accurate location is effected by the master mask 4, all the parts of the film subject to yellow, blue or white light being exposed. The positioning tolerance of the diameter and location of the holes and rings on the diaphragm is approximately equal to half the width of the blue rings. At the situations where the blue light from ring 15 overlaps the yellow ring 11, substantially no actinic light passes.

It will thus be seen that the film, after location in the optical system, can be provided with blackened spots after development, the location and areas thereof being determined with great accuracy. Rotation of the diaphragm 3 so as to index a different hole with the optical system, chooses another ring on the master mask 4, though the diameter of the spot thus produced and its location are determined by the mask 4 and not the diaphragm 3.

Although the invention has been described in connection with the overlapping of a pair of complementary colors, it will be understood that the invention could also be achieved by the use of masks of polarized light. Thus the rings on the master mask 4 could be polarized in one direction and the rings on the diaphragm 3 polarized in the opposite direction. At their points of overlap they would provide a black area, the spot to be illuminated being determined by the size and position of the master mask 4, whilst the diaphragm 3 would as before choose the size of spot to be illuminated.

It should be noted particularly from FIG. 2 that even though the blue ring of the diaphragm 3 may not be located exactly concentrically with the yellow rings of the master mask 4, it is the edge of a ring on the master mask 4 which determines the position and size of the spot to be exposed.

In a still further embodiment of our invention, we may arrange for primary and secondary holes to be provided in one or more diaphragms, the primary hole illuminating a particular chosen ring of the master mask, and the secondary hole illuminating most of the center portion of the image of the ring so chosen, the two illuminations being superposed on the film. In this case the rings on the master mask are black on a transparent background, so that as before, the mask shape and position in conjunction with the primary hole determine the shape and position of the spot produced on the photographic film, whilst illumination from the secondary hole exposes the film at the location of any master rings inside the chosen one.

Any form of aperture or shape may be used, such as square, rectangular, triangular or curved, and the film may be traversed with respect to the optical system during exposure to produce exposed shapes different from those on the masks.

We claim:

1. Apparatus for forming a photographic image comprising a source of light, a diaphragm having a plurality of patterned transparent sections, a transparent master mask defining a plurality of accurately dimensioned shapes and fixed accurately with respect to an optical system adapted to project an image of the master mask on a photographic base, and means enabling said variable diaphragm patterned transparent sections to be selectively registered relative to said master mask whereby it may be determined which of said master mask shapes is effectively projected by the light from said source on said photographic base.

2. Apparatus as recited in claim 1 wherein the shapes on both said master mask and said variable diaphragm are circular.

3. Apparatus as recited in claim 2 wherein the shapes defined on said master mask are concentric annuli.

4. Apparatus as recited in claim 2 in which each aperture in said variable diaphragm has an internal transparent border of a predetermined color, and in which each shape on said master mask is defined in a complementary color such that when light passing through said border falls on said pattern of complementary color, substantially no actinic light passes therethrough.

5. Apparatus as recited in claim 4, modified in that each transparent border is of material which polarizes light in a predetermined direction and each master mask shape is of a material which polarizes light in a direction transverse to said predetermined direction.

6. Apparatus as claimed in claim 1 wherein said variable diaphragm is a disc pivoted at the center of said disc, a plurality of apertures defined in said disc, and means for indexing said disc so as to bring said apertures one at a time into operative relationship with said master mask.

7. Apparatus as recited in claim 1, including means for moving said photographic base during exposure.

8. Apparatus as recited in claim 1 wherein primary and secondary holes are defined in at least on diaphragm, the primary hole illuminating a particular chosen pattern of said master mask, the patterns thereof being substantially concentric, while a secondary hole illuminates most of the center position of the image of the chosen master pattern, with means for superimposing the two illuminations on said photographic base.

* * * * *